United States Patent [19]

Duerrschnabel et al.

[11] Patent Number: 4,678,637

[45] Date of Patent: Jul. 7, 1987

[54] COPPER-CHROMIUM-TITANIUM-SILICON ALLOY AND APPLICATION THEREOF

[75] Inventors: Wolfgang Duerrschnabel, Bellenberg; Franz Puckert, Illerrieden; Heinrich Stueer, Voehringen; Max Bletschacher, Voehringen-Illerberg, all of Fed. Rep. of Germany

[73] Assignee: Weiland-Werke AG, Ulm, Fed. Rep. of Germany

[21] Appl. No.: 883,871

[22] Filed: Jul. 9, 1986

[30] Foreign Application Priority Data

Jul. 31, 1985 [DE] Fed. Rep. of Germany ....... 3527341

[51] Int. Cl.$^4$ ................................................ C22C 9/00
[52] U.S. Cl. ..................................... 420/490; 420/492
[58] Field of Search ................................. 420/490, 492

[56] References Cited

U.S. PATENT DOCUMENTS

| | | | |
|---|---|---|---|
| 1,930,956 | 10/1933 | Hazeltine | 420/490 |
| 2,189,198 | 2/1940 | Comstock | 75/160 |
| 2,212,017 | 8/1940 | Fletcher | 420/490 |
| 4,072,513 | 2/1978 | Shapiro | 420/490 |

OTHER PUBLICATIONS

Leadframe Materials from Tamagawa, Tamagawa Metal & Machinery Co., Ltd., 1983, title page and pp. i–iii and 3–4 and 10.

*Primary Examiner*—Peter D. Rosenberg
*Attorney, Agent, or Firm*—Flynn, Thiel, Boutell & Tanis

[57] ABSTRACT

The invention relates to a copper-chromium-titanium-silicon alloy which consists of 0.1 to 0.5% chromium, 0.05 to 0.5% titanium and 0.01 to 0.1% silicon, the remainder comprising copper and usual impurities. Because of its excellent properties as regards electrical and thermal conductivity, mechanical strength, resistance to softening, homogeneity and flexibility, the alloy is employed as a material for electronic components, in particular semiconductor carriers for transistors, integrated circuits or the like, and parts for electrical systems for cars.

4 Claims, 1 Drawing Figure

COPPER-CHROMIUM-TITANIUM-SILICON ALLOY AND APPLICATION THEREOF

FIELD OF THE INVENTION

The invention relates to a copper-chromium-titanium-silicon alloy, as well as the application thereof.

BACKGROUND OF THE INVENTION

There is a great need for copper alloys for electrical application purposes. These alloys are required, inter alia, as materials for electronic components, in particular semiconductor carriers for transistors, integrated circuits or the like, and parts for electrical systems for cars.

Materials for electronic components, in particular semiconductor carriers of the type mentioned (so-called lead frames), must exhibit particular combinations of properties:

(a) The electrical and thermal conductivity should be as high as possible (for example, above 65% IACS);

(b) High mechanical strength is required, together with sufficient bendability;

(c) In addition, a high degree of resistance to softening is required. In this connection, a measure of the resistance to softening is the so-called semihardening temperature $T_H$, which is obtained from the softening curve (Vickers hardness HV as a function of the annealing temperature T). In this connection, the semi hardening temperature $T_H$ is correlated with the value $$HV_{min} + \left( \frac{HV_{max} - HV_{min}}{2} \right)$$

(d) There is to an increasing extent a requirement for homogeneous materials, i.e. materials the structure of which does not include any coarse precipitates or inclusions. This leads on the one hand to a perfect connection between the so-called bonding wires and the semiconductor carrier, and on the other hand, if required for the further processing steps, satisfactory properties regarding galvanic or chemical surface refinement.

Iron-nickel alloys or copper alloys, such as for example CuFe2P (C 19400) or CeFeSnP (C 19520), inter alia, have to date been employed to a large extent for the abovementioned case of application. Even in the case of the abovementioned copper alloys, in particular the electrical conductivity and, because of the relatively high alloy proportion, which in some cases leads to undesirably coarse precipitates, also the homogeneity of the materials still leave something to be desired.

For connecting components in electrical systems for cars, because of the high current loading, there is a requirement for a material with the highest possible electrical and thermal conductivity, with at the same time high strength and thus sufficient mechanical stability, as well as improved corrosion resistance in relation to brass alloys. In addition, it should be possible to produce the material at low cost.

The object of the invention is, accordingly, to provide a copper alloy which, in particular for the abovementioned fields of application, exhibits particularly favorable properties at a relatively low price.

BRIEF DESCRIPTION OF THE DRAWING

The drawing is a photomicrograph of a specimen of alloy 2 described below at the magnification of 1000X.

DETAILED DESCRIPTION

According to the invention, the object is achieved by a copper-chromium-titanium-silicon alloy which is characterized in that it consists essentially of 0.1 to 0.5%, preferably 0.15 to 0.4%, chromium,
0.05 to 0.5%, preferably 0.1 to 0.4%, titanium and
0.01 to 0.1%, preferably 0.02 to 0.07%, silicon,
the remainder comprising copper and usual impurities.

(The percentages indicated above relate to percentages by weight.)

The advantageous properties of the alloy according to the invention will be set forth in greater detail below, with reference to an exemplary embodiment. The alloy is, moreover, of low price, as a result of the small content of relatively cheap alloy elements and as a result of production in a simple manner.

From West German OffenLegungsschrift No. 1 758 055 it is indeed possible to infer an alloy with 0.3 to 7% chromium and/or titanium and 0.1 to 3% silicon, but this does not provide a person skilled in the art with any suggestion of reducing the silicon content to below 0.1%. Such low silicon contents were formerly regarded rather as disadvantageous for the combinations of properties of this group of alloys.

A copper-chromium-titanium-silicon alloy with approximately 0.1 to 0.6% chromium, approximately 0.6 to 1.5% titanium and 0.1 to 0.6% silicon is indeed also known from U.S. Pat. No. 2 189 198; however, particularly good resuls are in that case achieved with a titanium content of approximately 1%, so that it was, in particular, not obvious to select a titanium content below 0.6%.

According to a preferred embodiment of the present invention, the copper alloy consists essentially of 0.15 to 0.4% chromium, 0.1 to 0.4% titanium and 0.02 to 0.07% silicon, the remainder comprising copper and usual impurities.

Only in the case of the quantitative contents indicated above, are the optimal properties for lead frame materials attained by combination of the elements mentioned above.

Additions of a total of 0.1 to 0.5% nickel, tin, iron and cobalt, individually or in combination, are particularly preferred.

The copper-chromium-titanium-silicon alloy according to the invention is preferably employed as a material for electronic components, in particular semiconductor carriers for transistors, integrated circuits or the like and parts for electrical systems for cars.

The invention is explained in greater detail with reference to the following exemplary embodiment:

Table 1 shows the composition of two alloys according to the invention (No. 1, 2) as well as of a titanium-free comparison alloy (No. 3):

TABLE 1

| Designation of sample | Composition of the samples (quantities given in weight %) | | | |
|---|---|---|---|---|
| | Cr | Ti | Si | Cu |
| 1 | 0.33 | 0.10 | 0.05 | Remainder |
| 2 | 0.30 | 0.07 | 0.05 | Remainder |

TABLE 1-continued

| Composition of the samples (quantities given in weight %) | | | | |
| --- | --- | --- | --- | --- |
| Designation of sample | Cr | Ti | Si | Cu |
| 3 | 0.21 | n.d. | 0.10 | Remainder | n.d. = not detectable

The alloys 1 and 3 were produced in the following manner on a laboratory scale:

Cathode copper was melted at approximately 1,200° C. in a Tamman furnace with a charcoal cover. After this, the alloy elements chromium and silicon or chromium, silicon and titanium were added to the melt in the form of appropriate master alloys. The master alloys contained 9.45% chromium, 10.05% silicon and 28.0% titanium in pure form. After complete dissolution of the alloy elements, the melt was cast in an ingot mould having dimensions of 25×50×100 mm. After this, the cast blocks were homogenized at 900° C. for 1 hour and continuously cooled in air. Cold rolling to an intermediate thickness of 0.75 mm was followed by annealing at 500° C. for 1 hour, as well as pickling in dilute sulfuric acid to remove the scale layer. After final rolling by 60%, the tensile strength, the semihardening temperature, the Vickers hardness and the electrical conductivity were determined.

In addition, the same properties were investigated in a strip material, which was hot-rolled and cold-rolled under operational conditions, of the alloy 2 according to the invention, after final rolling by 66%.

The mechanical and electrical properties of the samples are summarized in Table 2, together with the corresponding values for alloys of the prior art, which were taken from the literature (cf., for example, the company leaflet "Leadframe Materials from Tamagawa" (1983), especially pages 3, 4 and 10, from the company Tamagawa Metal & Machinery Co., Ltd.).

TABLE 2

| | | Electrical and mechanical properties (Condition: hard; cold-formed by 60%; strip thickness: 0.3 mm) | | | |
| --- | --- | --- | --- | --- | --- |
| Designation of the samples | (UNS designation) | Tensile strength (N/mm$^2$) | Semihardening temperature $T_H$(°C.) | Vickers hardness HV | Electrical conductivity (% IACS) |
| 1 | | 540 | 440 | 155 | 76 |
| 2* | | 590 | 440 | 175 | 75 |
| CuFe2P | (C19400) | 480 | 400 | 145 | 65 |
| CuFeSnP | (C19520) | 540 | 450 | 165 | 48 |
| CuZn15 | (C23000) | 450 | 380 | 135 | 37 |
| 3 | | 460 | 360 | 140 | 63 |

*66% cold-forming; strip thickness: 0.25 mm

It is evident that the alloys 1 and 2 according to the invention exhibit a significantly higher conductivity than the alloys according to the prior art. In this connection, the alloy 2 in particular also achieves unsurpassed strength and hardness values.

A comparison of the values of the alloys 1 and 2 according to the invention with those of the titanium-free alloy 3 also shows the favorable effect of the addition of titanium to a copper-chromium-silicon alloy.

The excellent mechanical and electrical properties of the alloy according to the invention are obtained as a result of precipitates—which are extremely fine and homogeneously distributed in the copper matrix—of the participating alloy elements chromium, titanium and silicon. The figure shows the structure of the alloy 2 according to the invention, in the tempered condition, at a magnification of about 1,000:1. It is evident from this that the very small precipitated particles, which increase the strength and conductivity, are of the order of magnitude of 1 μm and below.

This favorable precipitation characteristic is achieved without the special heat treatment, with quenching in water and subsequent tempering, which is customary in the case of precipitate-forming alloys. It is developed in the course of the mode of production which is customary in the case of work hardening copper alloys and which is characterized by the steps of initial heating, hot working, cooling in air, cold rolling and intermediate annealing in alternation. Accordingly, the alloy possesses substantial advantages, in terms of production technology, as compared with the previously known copper-chromium-silicon or copper-chromium-titanium alloys.

Without loss of properties, this simplified and thus less expensive mode of production (without a quenching treatment) can only be achieved with the combination, present in the alloys according to the invention, of the alloy elements and their low contents. In the case of higher proportions of the alloy elements chromium, titanium and silicon than those of the alloy according to the invention, there is a deterioration of at least one of the abovementioned properties, but usually of several properties at the same time.

A property of the alloy according to the invention to which particular emphasis should be given is the good bendability. Even in the hard-rolled condition, it is possible with the highest strengths and hardnesses to undertake sharp-edged 90° bends, both perpendicular and parallel to the direction of rolling, without the formation of cracks. On the other hand, copper-chromium-silicon and copper-chromium-titanium alloys of the previously known compositions exhibit significantly worse bending properties. The fine and homogeneously distributed precipitate particles are likewise responsible for the excellent bendability of the alloys according to the invention, since these clearly retard or prevent the propagation of cracks into the interior of the strip. Metallographic investigations have established that an incipient flaw does not further proceed perpendicular to the surface of the strip, but is deflected approximately parallel to the surface of the strip, so that only a certain degree of pitting but no actual crack arises. This bending behavior is in particular of great importance in the case of so-called surface-mounted devices (SMD), since the connecting leads are to be bent in a sharp-edged manner and should thereafter as far as possible no longer exhibit any spring-back resilience.

The embodiments of the invention in which an exclusive property or privilege is claimed are defined as follows:

1. Copper-chromium-titanium-silicon alloy, consisting essentially of 0.1 to 0.5% chromium, 0.05 to 0.5% titanium, 0.01 to 0.1% silicon, and the remainder being copper and usual impurities.

2. An alloy according to claim 1 which contains a total of 0.1 to 0.5% of one or more alloying elements selected from the group consisting of nickel, tin, iron and cobalt.

3. Copper-chromium-titanium-silicon alloy, consisting essentially of 0.15 to 0.4% chromium, 0.1 to 0.4% titanium, 0.02 to 0.07% silicon, and the remainder being copper and usual impurities.

4. An alloy according to claim 4 which contains a total of 0.1 to 0.5% of one or more alloying elements selected from the grouop consisting of nickel, tin, iron and cobalt.

* * * * *

UNITED STATES PATENT AND TRADEMARK OFFICE
CERTIFICATE OF CORRECTION

PATENT NO. : 4,678,637

DATED : July 7, 1987

INVENTOR(S) : Wolfgang Duerrschnabel et al

It is certified that error appears in the above-identified patent and that said Letters Patent is hereby corrected as shown below:

Column 4, line 64; change "claim 4" to ---claim 3---.

Signed and Sealed this

Eighth Day of December, 1987

Attest:

DONALD J. QUIGG

*Attesting Officer*   *Commissioner of Patents and Trademarks*